(12) United States Patent
Yang et al.

(10) Patent No.: US 9,094,113 B2
(45) Date of Patent: Jul. 28, 2015

(54) APPARATUS AND METHOD FOR REDUCING PHASE NOISE IN NEAR FIELD COMMUNICATION DEVICE SIGNALING

(71) Applicant: QUALCOMM Incorporated, San Diego, CA (US)

(72) Inventors: Eugene Yang, San Diego, CA (US); Eunmo Kang, San Diego, CA (US); Faramarz Sabouri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 144 days.

(21) Appl. No.: 13/841,155

(22) Filed: Mar. 15, 2013

(65) Prior Publication Data

US 2014/0273828 A1 Sep. 18, 2014

(51) Int. Cl.
| | |
|---|---|
| *H04B 5/00* | (2006.01) |
| *H04B 15/00* | (2006.01) |
| *H03D 3/00* | (2006.01) |
| *H03D 7/16* | (2006.01) |
| *H04L 27/20* | (2006.01) |
| *H04L 27/00* | (2006.01) |

(Continued)

(52) U.S. Cl.
CPC .............. *H04B 15/00* (2013.01); *H03D 3/009* (2013.01); *H03D 7/165* (2013.01); *H04B 5/00* (2013.01); *H04L 27/206* (2013.01); *H04L 27/2092* (2013.01); *H04L 7/033* (2013.01); *H04L 25/4902* (2013.01); *H04L 2027/0018* (2013.01); *H04L 2027/0057* (2013.01); *H04L 2027/0067* (2013.01)

(58) Field of Classification Search
USPC ........ 455/41.1, 41.2, 63.1, 67.11, 67.13, 296, 455/226.1, 226.2, 226.3, 255–260, 265; 340/10.1, 13.24, 13.25, 13.26
See application file for complete search history.

(56) References Cited

U.S. PATENT DOCUMENTS

| | | |
|---|---|---|
| 4,475,088 A | 10/1984 | Beard |
| 7,164,329 B2 | 1/2007 | Toncich et al. |
| 7,253,717 B2 * | 8/2007 | Armstrong et al. .......... 340/10.2 |

(Continued)

FOREIGN PATENT DOCUMENTS

JP 2007-189338 A 7/2007

OTHER PUBLICATIONS

Holtzman, "Phase Noise Cancellation in RF Transceivers", IMS2007 Application Note, May 2007, retrieved from http://www.mw-elisra.com/pdf/45070413-EAN.PDF.

(Continued)

*Primary Examiner* — Tuan A Tran
(74) *Attorney, Agent, or Firm* — Arent Fox LLP

(57) ABSTRACT

A method for communication between near field communication (NFC) devices includes generating a transmission signal, an in-phase local oscillator signal, and a quadrature local oscillator signal from edges of an input clock signal. The method further includes mixing a load modulated signal with the in-phase local oscillator signal to generate an in-phase baseband signal. The method further includes mixing the load modulated signal with the quadrature local oscillator signal to generate a quadrature baseband signal. The method further includes adjusting a phase delay of at least one of the in-phase local oscillator signal or the quadrature local oscillator signal in response to a first signal strength of the in-phase baseband signal and a second signal strength of the quadrature baseband signal.

30 Claims, 5 Drawing Sheets

(51) Int. Cl.
*H04L 25/49* (2006.01)
*H04L 7/033* (2006.01)

(56) References Cited

U.S. PATENT DOCUMENTS

| | | | |
|---|---|---|---|
| 7,336,730 | B2 | 2/2008 | Auranen et al. |
| 7,786,923 | B2 * | 8/2010 | Nagai ............................ 342/42 |
| 7,825,773 | B2 * | 11/2010 | Koo et al. .................... 340/10.4 |
| 7,873,121 | B2 * | 1/2011 | Frederick et al. ............. 375/316 |
| 7,889,057 | B2 * | 2/2011 | Seon ............................ 340/10.2 |
| 7,986,916 | B2 | 7/2011 | Williams |
| 8,064,873 | B2 * | 11/2011 | Wu et al. ...................... 455/336 |
| 8,224,262 | B2 * | 7/2012 | Oishi et al. ................... 455/90.3 |
| 8,233,872 | B2 * | 7/2012 | Nagai et al. .................. 455/296 |
| 8,446,254 | B2 * | 5/2013 | Carrick et al. ............... 340/10.1 |

| | | |
|---|---|---|
| 2003/0012305 A1 | 1/2003 | Auranen |
| 2011/0007841 A1 | 1/2011 | Ben-Ayun et al. |
| 2011/0039509 A1 | 2/2011 | Bruchner |
| 2012/0064844 A1 | 3/2012 | Miyashita et al. |

OTHER PUBLICATIONS

Kim E-H., et al., "An isolator-less CMOS RF front-end for UHF mobile RFID reader", 2011 IEEE International Solid-State Circuits Conference Digest of Technical Papers (ISSCC), 2011, pp. 456-458.
Podesta J.J., "Phase Noise Cancellation in a Mixer Circuit: Analysis Using a Random Phase Function", US Army Armament Research, Development and Engineering Center, Jan. 1996, 48 pages.
International Search Report and Written Opinion—PCT/US2014/021939—Sep. 29, 2014.

\* cited by examiner

APPARATUS AND METHOD FOR REDUCING PHASE NOISE IN NEAR FIELD COMMUNICATION DEVICE SIGNALING

I. FIELD

The present disclosure is generally related to reducing phase noise in Near Field Communication device signaling.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless computing devices may utilize a Near Field Communication (NFC) standard to communicate with other nearby devices that utilize the NFC standard. As an example, a mobile phone utilizing the NFC standard may operate in an initiator mode and read data from an electronic device (e.g., a nearby second wireless device that uses the NFC standard) operating in a target mode when the mobile phone and the electronic device are within a close proximity to each other. For example, in initiator mode, the mobile phone may transmit radio-frequency (RF) signals to the electronic device and may receive corresponding RF signals from the electronic device. The corresponding RF signals represent data provided by the electronic device using load modulation. The load modulation may be obscured by phase noise of the mobile phone. Low phase noise phase locked loops (PLLs) may reduce phase noise generated at the mobile phone in the initiator mode. However, use of low phase noise PLLs increases power consumption and consumes die area within the mobile phone.

III. SUMMARY

Methods and devices to reduce phase noise in Near Field Communication (NFC) device signaling are disclosed. An NFC initiator device may generate a transmission signal and communicate the transmission signal to an NFC target device. After receiving the transmission signal, the NFC target device may communicate data to the NFC initiator device via load modulation of an electromagnetic field. The NFC initiator device receives a load modulated signal corresponding to the data from the NFC target device based on characteristics of the electromagnetic field. The load modulated signal may be mixed with an in-phase local oscillator signal and a quadrature local oscillator signal at the NFC initiator device to generate an in-phase and quadrature baseband signal, respectively. Signal strengths of the in-phase and quadrature baseband signals may be determined at the NFC initiator device. The phase of the in-phase local oscillator signal and/ or the phase of the quadrature local oscillator may be periodically adjusted at the NFC initiator device by sampling different edges of an oversampled clock from which the local oscillator and the transmission signal are derived to improve the signal strength, and simultaneously reduce the phase noise, of at least one of the in-phase baseband signal or the quadrature baseband signal.

In a particular embodiment, a method for reducing phase noise during Near Field Communication (NFC) device signaling includes generating a transmission signal, an in-phase local oscillator signal, and a quadrature local oscillator signal from edges of an input clock signal. The method further includes mixing a load modulated signal with the in-phase local oscillator signal to generate an in-phase baseband signal. The method further includes mixing the load modulated signal with the quadrature local oscillator signal to generate a quadrature baseband signal. The method further includes adjusting a phase delay of the in-phase local oscillator signal or the quadrature local oscillator signal in response to a first signal strength of the in-phase baseband signal and a second signal strength of the quadrature baseband signal.

In another particular embodiment, an apparatus for reducing phase noise during Near Field Communication (NFC) device signaling includes an NFC initiator device. The NFC initiator device includes a ring oscillator and a clock generator coupled to the ring oscillator. A transmission signal from the clock generator is based on a clock signal that is generated by the ring oscillator. The NFC initiator device further includes a first mixer that is responsive to an in-phase local oscillator signal and to a load modulated signal that is generated based on NFC signaling with an NFC target device. The NFC initiator device further includes a second mixer that is responsive to a quadrature local oscillator signal and to the load modulated signal. An in-phase baseband signal is generated at the first mixer based on the in-phase local oscillator signal and the load modulated signal. A quadrature baseband signal is generated at the second mixer based on the quadrature local oscillator signal and the load modulated signal. Signal strengths of the in-phase baseband signal and the quadrature baseband signal are measured, and a phase of the in-phase local oscillator signal and a phase of the quadrature local oscillator signal are adjusted based on the measured signal strengths.

One particular advantage provided by at least one of the disclosed embodiments is an ability to selectively adjust the relative phase of an in-phase local oscillator signal and a quadrature local oscillator signal to a received signal by monitoring the signal strengths of in-phase and quadrature baseband signals. A result of identifying and operating with this phase relationship is the coherent reduction of downconverted phase noise generated by an NFC initiator device, enabling NFC communications over greater distances due to reduced phase noise while reducing power consumption and reducing die area consumption at the NFC initiator device. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
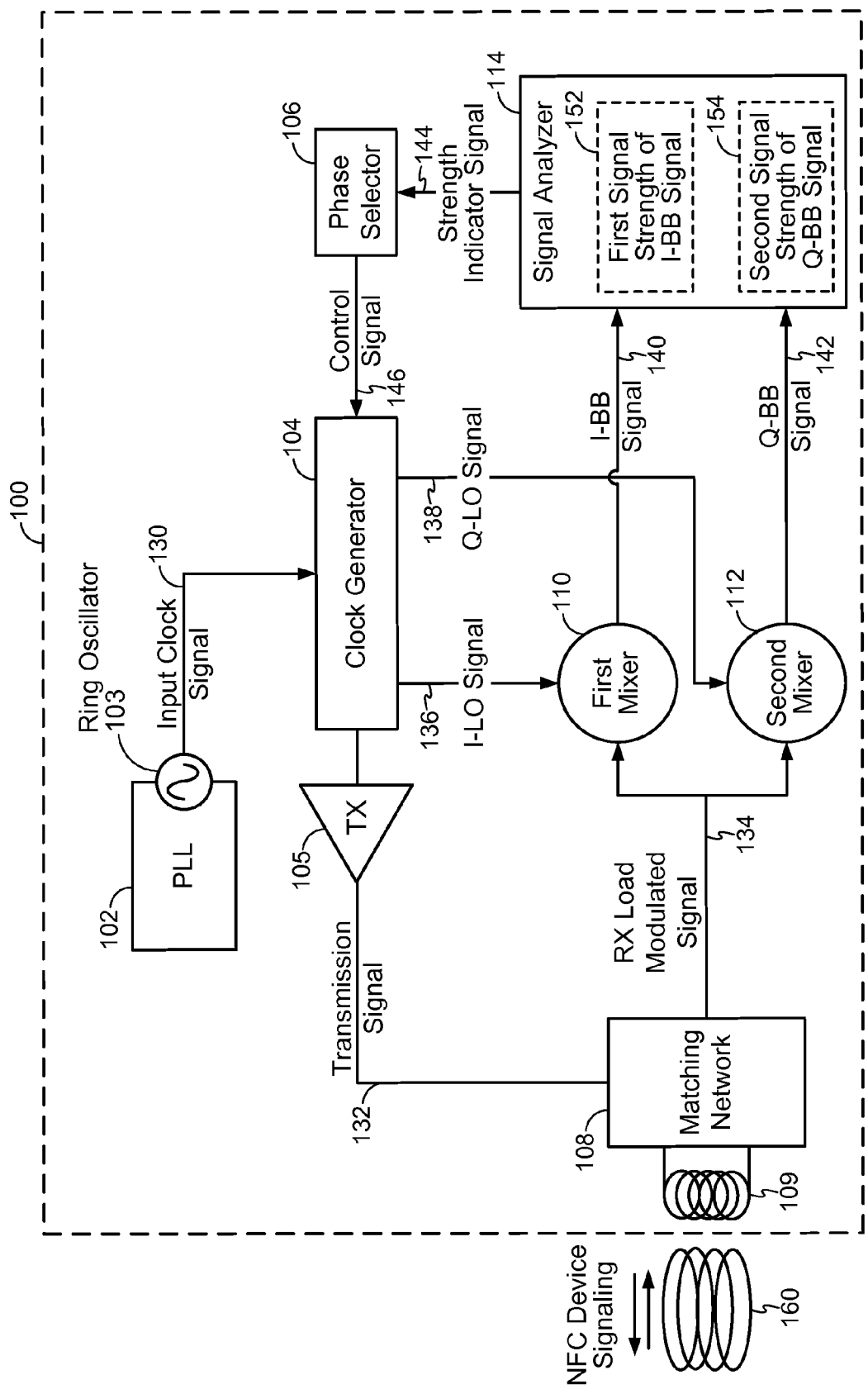
FIG. 1 is a block diagram of a particular illustrative embodiment of a Near Field Communication (NFC) initiator system that is operable to reduce a phase noise during NFC device signaling.

Referring to FIG. 1, a block diagram of a particular illustrative embodiment of a Near Field Communication (NFC) initiator system 100 that is operable to reduce phase noise during NFC device signaling is shown. The NFC initiator system 100 includes a phase locked loop (PLL) 102, a clock generator 104 with an adjustable phase (e.g., an edge selector), a transmission amplifier (TX) 105, a phase selector 106, a matching network 108, a first mixer 110, a second mixer 112, and a signal analyzer 114. The first and second mixers 110, 112 may be in a radio frequency analog domain. For example, the first and second mixers 110, 112 may process radio frequency signals and down-convert the radio frequency signals into baseband signals. The clock generator 104 and the signal analyzer 114 may be in a digital baseband domain. For example, the clock generator 104 and the signal analyzer 114 may process baseband signals.

The PLL 102 may include a ring oscillator 103 that is configured to generate an input clock signal 130 (i.e., an oversampling clock signal). For example, as explained with respect to FIG. 2, the input clock signal 130 may have a frequency of approximately 433.92 megahertz (MHz) (e.g., substantially 32 times a carrier frequency ($f_C$) of 13.56 MHz). The input clock signal 130 is provided to an input of the clock generator 104.

The clock generator 104 may be coupled to the ring oscillator 103. For example, the clock generator 104 may be coupled to receive the input clock signal 130 that is generated by the ring oscillator. In response to receiving the input clock signal 130 from the ring oscillator, the clock generator 104 is configured to generate a clock signal and to provide the clock signal to the transmission amplifier 105. The transmission amplifier 105 is configured to generate a transmission signal 132 (e.g., a pulse width modulation (PWM) clock signal) having the carrier frequency ($f_C$). The clock generator 104 is further configured to generate a pair of local oscillator signals 136, 138 having the carrier frequency ($f_C$). For example, as explained with respect to FIG. 2, the clock generator 104 may select particular clock edges of the input clock signal 130 (e.g., sample the input clock signal 130 at a rate equal to the carrier frequency ($f_C$)) to generate the transmission signal 132, a first local oscillator signal 136, and a second local oscillator signal 138. The first local oscillator signal 136 may be an in-phase local oscillator signal, and the second local oscillator signal 138 may be a quadrature local oscillator signal. A difference between the phase of the first local oscillator signal 136 and the phase of the second local oscillator signal 138 may be substantially ninety degrees. The transmission amplifier 105 may be configured to provide the transmission signal 132 to the matching network 108, to provide the first local oscillator signal 136 to the first mixer 110, and to provide the second local oscillator signal 138 to the second mixer 112. As explained below, the clock generator 104 may be responsive to a control signal 146 to adjust a phase of the first local oscillator signal 136 and the phase of the second local oscillator signal 138 by a programmable amount.

The matching network 108 is configured to communicate the transmission signal 132 having the carrier frequency ($f_C$) to an NFC target device via an inductive coil 109. The NFC target device may communicate to the NFC initiator system 100 by performing load modulation on a carrier generated by the NFC initiator system 100. Upon receiving the load modulated carrier, the matching network 108 may send a load modulated signal 134 to the first mixer 110 and to the second mixer 112. The load modulated signal 134 may correspond to a delayed version of the transmission signal 132 due to phase delays through the matching network 108. The load modulated signal 134 may have a small amount of amplitude and/or phase modulation imposed by the load modulation performed at the NFC target device.

The first mixer 110 is configured to receive the first local oscillator signal 136 and the load modulated signal 134, each having the carrier frequency ($f_C$). The first mixer 110 is further configured to mix the first local oscillator signal 136 and the load modulated signal 134 to generate a first baseband signal 140. For example, the first mixer 110 may perform down-conversion mixing by multiplying the first local oscillator signal 136 and the load modulated signal 134 to generate the first baseband signal 140. The first baseband signal 140 may be an in-phase baseband signal. The second mixer 112 is configured to receive the second local oscillator signal 138 and the load modulated signal 134, each having the carrier frequency ($f_C$). The second mixer 112 is further configured to mix the second local oscillator signal 138 and the load modulated signal 134 to generate a second baseband signal 142. For example, the second mixer 112 may perform down-conversion mixing by multiplying the second local oscillator signal 138 and the load modulated signal 134 to generate the second baseband signal 142. The second baseband signal 142 may be a quadrature baseband signal. The first and second baseband signals 140, 142 may be provided to the signal analyzer 114.

The signal analyzer 114 may correspond to a direct-current (DC) calibration unit. The signal analyzer 114 may be configured to receive the first and second baseband signals 140, 142 and to perform DC averaging on each baseband signal 140, 142. For example, as explained with respect to FIG. 3, the signal analyzer 114 may measure a first signal strength 152 of the first baseband signal 140 (i.e., the in-phase baseband signal) and a second signal strength 154 of the second baseband signal 142 (i.e., the quadrature baseband signal) for different phases of the local oscillator signals 136, 138 as compared to the load modulated signal 134. The signal strengths 152, 154 of the baseband signals 140, 142 may correspond to a DC voltage level of the baseband signals 140, 142. The signal analyzer 114 is further configured to generate a strength indicator signal 144. The strength indicator signal 144 may indicate individual DC voltage levels of the baseband signals 140, 142. The strength indicator signal 144 is provided to the phase selector 106.

The phase selector 106 is configured to evaluate information corresponding to the strength indicator signal 144. The information may include the first signal strength 152 of the first baseband signal 140, a first phase delay of the first local oscillator signal 136 associated with the first signal strength, the second signal strength 154 of the second baseband signal 142, and a second phase delay of the second local oscillator signal 138 associated with the second signal strength. The first phase delay and the second phase delay may be stored within the phase selector 106, and the first signal strength 152 and the second signal strength 154 may be sent to the phase selector 106 via the strength indicator signal 144. In a particular embodiment, a processor within the phase selector 106 may evaluate the information. Based on the first and second signal strengths 152, 154, the phase selector 106 may determine a phase for at least one of the local oscillator signals 136, 138 that may reduce or minimize a phase noise power of a corresponding baseband signal 140, 142. For example, the phase selector 106 may generate one or more control signals 146 indicating different programmable delay parameters. Each programmable delay parameter may correspond to different phases (i.e., different phase delays or phase shifts) of the local oscillator signals 136, 138. In some embodiments, the phase selector 106 may select a programmable delay parameter that corresponds to the highest determined first signal strength 152 of the first baseband signal 140 to reduce or minimize a phase noise corresponding to an in-phase path. In other embodiments, the phase selector 106 may select a programmable delay parameter that corresponds to the highest determined second signal strength 154 of the second baseband signal 142 to reduce or minimize a phase noise corresponding to a quadrature path.

Thus, the phase selector 106 may send one or more control signals 146 to the clock generator 104 to adjust a phase delay of the first local oscillator signal 136 (i.e., the in-phase local oscillator signal) or the second local oscillator signal 138 (i.e., the quadrature local oscillator signal) in response to the first signal strength 152 of the first baseband signal 140 and the second signal strength 154 of the second baseband signal 142. The clock generator 104 may adjust the phase delay of the local oscillator signals 136, 138 by selectively sampling the input clock signal 130 at different clock edges in accordance with the carrier frequency ($f_C$), as described further with respect to FIG. 2.

When the phase of the transmission signal 132 is maintained to be substantially constant, adjusting the phase of the local oscillator signals 136, 138 adjusts a phase difference between the transmission signal 132 and the local oscillator signals 136, 138. When the phase difference between the transmission signal 132 and the local oscillator signals 136, 138 is adjusted, the phase difference between the load modulated signal 134 and the local oscillator signals 136, 138 is also adjusted due to the phase delay associated with the matching network 108. The phase delay may be adjusted by the NFC initiator system 100 to reduce phase during data communication with a wireless system that uses electromagnetic fields to transfer data. For example, in a particular embodiment, the phase delay may be adjusted by the NFC initiator system 100 to reduce phase noise during data communication with a radio frequency identification (RFID) tag of the NFC target device.

When the phase difference between the load modulated signal 134 and the first local oscillator signal 136 is adjusted, the first mixer 110 may generate the first baseband signal 140 having an adjusted DC voltage level (i.e., an adjusted first signal strength). In a similar manner, when the phase difference between the load modulated signal 134 and the second local oscillator signal 138 is adjusted, the second mixer 112 may generate the second baseband signal 142 having an adjusted DC voltage level. The phase noise of the first baseband signal 140 may be reduced as the DC voltage level of the first baseband signal 140 increases, and the phase noise of the second baseband signal 142 may be reduced as the DC voltage level of the second baseband signal 142 increases. As explained with respect to FIG. 3, the phase difference between the load modulated signal 134 and the pair of local oscillator signals 136, 138 may be adjusted to reduce phase noise for at least one of the baseband signals 140, 142. Upon obtaining a desired phase noise (or signal strength) for a particular baseband signal 140, 142, the NFC initiator system 100 may tune to a path associated with the particular baseband signal 140, 142. For example, upon obtaining the desired first signal strength 152 for the first baseband signal 140 (i.e., the in-phase baseband signal), the NFC initiator system 100 may tune to an in-phase path to reduce phase noise that may result from communicating with the NFC target device. For example, the NFC initiator system 100 may select the first baseband signal 140 and perform demodulation and other signal processing on the first baseband signal 140 while suspending signal processing on the second baseband signal 142.

During operation, the phase selector 106 may scan through different values of programmable delay parameters and received feedback (e.g. DC voltage level measurements for each baseband signal 140, 142) corresponding to each of the programmable delay parameters based on an evaluation of the strength indicator signal 144. For example, the phase selector 106 may scan through multiple programmable delay parameters that each correspond to a different phase delay of the local oscillator signals 136, 138. In a particular embodiment, the phase selector 106 may select a first programmable delay parameter corresponding to a first phase delay of the local oscillator signals 136, 138. The signal analyzer 114 may determine (i.e., measure) the first signal strength 152 of the first baseband signal 140 that corresponds to the first programmable delay parameter and determine the second signal strength 154 of the second baseband signal 142 that corresponds to the first programmable delay parameter. The first signal strength 152 and the second signal strength 154 may be sent to the phase selector 106 via the strength indicator signal 144. The phase selector 106 may store the received signal strength information and repeat the process for other programmable delay parameters corresponding to different phase delays of the local oscillator signals 136, 138 until the scan is completed.

After completing the scan, the phase selector 106 may select a programmable delay parameter based on the stored signal strength information. For example, the phase selector 106 may select a programmable delay parameter that corresponds to a substantially high DC voltage level of the first baseband signal 140 (i.e., the in-phase baseband signal) and a substantially low DC voltage level of the second baseband signal 142 (i.e., the quadrature baseband signal). The substantially high DC voltage level for the first baseband signal 140 may correspond to the in-phase path having low phase noise and the quadrature path having high phase noise. Because the first baseband signal 140 and the second baseband signal 142 are substantially ninety degrees out of phase, the delay parameter value that corresponds to the substantially low DC voltage level of the second baseband signal 142 may also correspond to the substantially high DC voltage level of the first baseband signal 140. Thus, the phase selector 106 may select the delay parameter value that corresponds to the substantially low DC voltage level of the second baseband signal 142 and tune to the path associated with the first baseband signal 140 (i.e., the in-phase path) to enhance accuracy when saturation may limit a signal strength at high DC voltage levels of the first baseband signal 140. For example, selecting the delay parameter value that corresponds to the substantially low DC voltage level of the second baseband signal 142 may mitigate the chance for the existence of another delay parameter value that corresponds to a higher DC voltage level of the first baseband signal 140. The NFC initiator system 100 may tune to the in-phase path by selecting the first baseband signal 140 and performing demodulation and other signal processing on the first baseband signal 140 while suspending signal processing on the second baseband signal 142. Alternatively, the phase selector 106 may select a programmable delay parameter that corresponds to a substantially high DC voltage level of the second baseband signal 142 and a substantially low DC voltage level of the first baseband signal 140.

It will be appreciated that the NFC initiator system 100 may selectively reduce a phase noise that may result from communicating with an NFC target device. For example, the NFC initiator system 100 may select a phase delay (i.e., a delay parameter) to generate a high DC voltage level for the first baseband signal 140 and may tune to an in-phase path, or may select a phase delay to generate a high DC voltage level for the second baseband signal 142 and may tune to a quadrature path. When the NFC initiator system 100 selects a phase delay that generates a high DC voltage level for the first baseband signal 140, the phase noise associated with the in-phase path may be reduced, resulting in improved signal quality (i.e., an improved signal-to-noise ratio (SNR)) when the NFC initiator system 100 tunes to the in-phase path. When the NFC initiator system 100 selects a phase delay that generates a high DC voltage level for the second baseband signal 142, the phase noise associated with the quadrature path may be reduced, resulting in improved signal quality when the NFC initiator system 100 tunes to the quadrature path. Alternatively, the NFC initiator system 100 may select a phase delay to generate a voltage level for the first baseband signal 140 substantially equaling a voltage level for the second baseband signal 142 and may tune to the in-phase path and the quadrature path. As the distance between the NFC initiator system 100 and an NFC target device increases, the amount of noise during signaling may also increase. Thus, improving the SNR may allow an increase in distance between the NFC initiator system 100 and the NFC target device.

Figure 2:
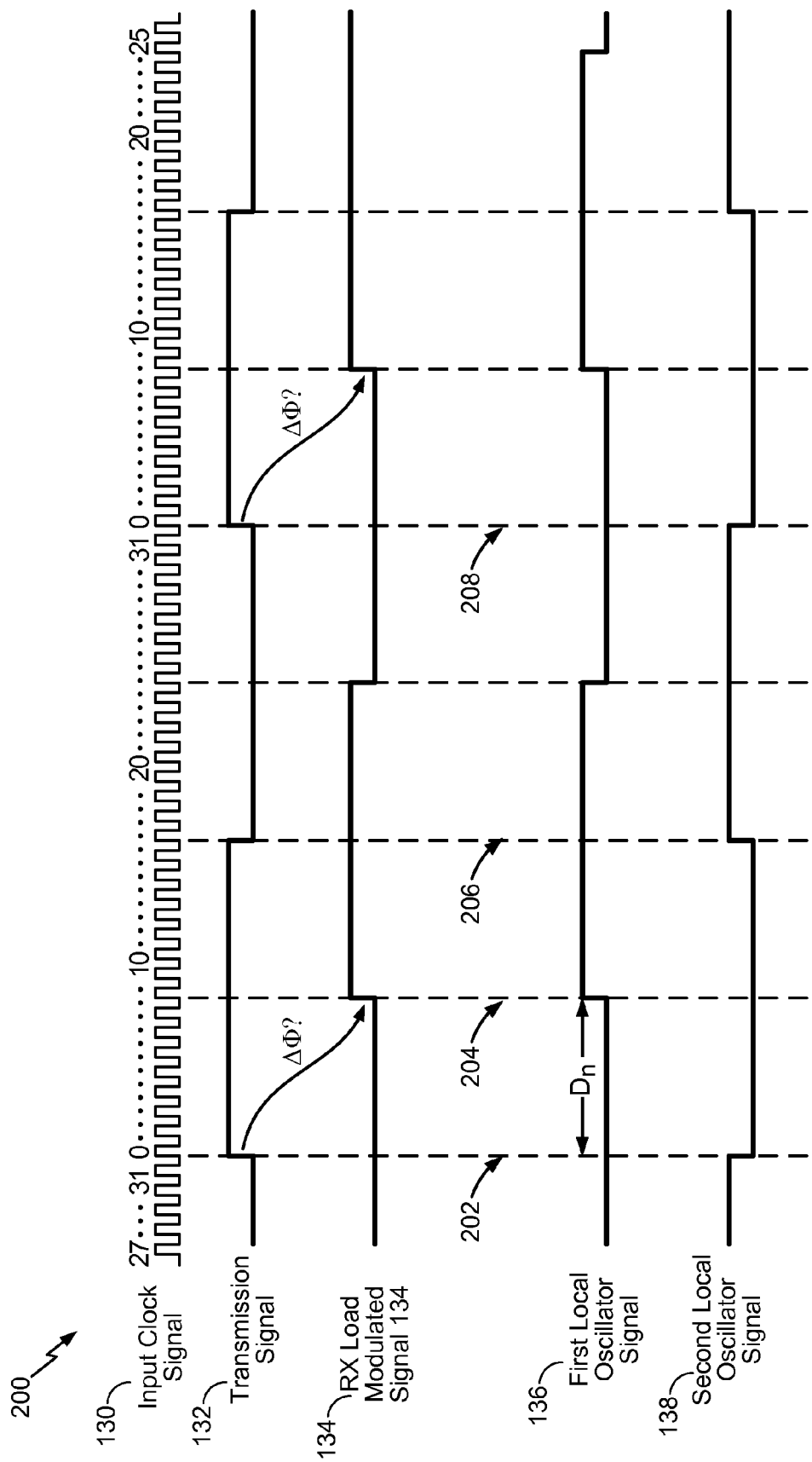
FIG. 2 is a particular embodiment of a timing diagram that illustrates a phase delay between a transmission signal and a received signal of the NFC initiator system of FIG. 1.

Referring to FIG. 2, a particular embodiment of a timing diagram 200 that illustrates a phase delay between the transmission signal 132 and the load modulated signal 134 of the NFC initiator system 100 is shown. The timing diagram 200 includes a first trace of the input clock signal 130, a second trace of the transmission signal 132, a third trace of the load modulated signal 134, a fourth trace of the first local oscillator signal 136, and a fifth trace of the second local oscillator signal 138.

The input clock signal 130 may be a high-frequency input clock signal. For example, the first trace of the input clock signal 130 may have a frequency of 433.92 MHz. The clock generator 104 of FIG. 1 may selectively sample clock edges of the input clock signal 130 to generate the transmission signal 132. For example, as illustrated by the second trace, the clock generator 104 may sample the input clock signal 130 at a rising edge 202 of a first clock pulse (i.e., clock pulse "0") to generate a rising edge of the transmission signal 132. In addition, the clock generator 104 may sample the input clock signal 130 at a rising edge 206 of a $17^{th}$ clock pulse (i.e., clock pulse "16") to generate a falling edge of the transmission signal 132. Thus, every sixteen clock pulses of the input clock signal 130 may correspond to a half-period of the transmission signal 132. Therefore, the input clock signal 130 may have a frequency that is approximately 32 times the carrier frequency ($f_C$) of the transmission signal 132.

As illustrated by the third trace, the load modulated signal 134 may be a delayed version of the transmission signal 132. For example, the load modulated signal 134 may have a frequency that is equal to the carrier frequency ($f_C$) of the transmission signal 132, however, a phase difference MD may exist between the transmission signal 132 and the load modulated signal 134.

As illustrated by the fourth trace, the clock generator 104 may selectively sample clock edges of the input clock signal 130 based on a programmable delay parameter ($D_n$) to generate the first local oscillator signal 136. For example, based on a particular programmable delay parameter ($D_n$), the clock generator 104 may sample the input clock signal 130 at a rising edge 204 of a $9^{th}$ clock pulse (i.e., clock pulse "8") to generate a rising edge of the first local oscillator signal 136. In addition, the clock generator 104 may sample the input clock signal 130 at a rising edge of a $25^{th}$ clock pulse (i.e., clock pulse "24") to generate a falling edge of the first local oscillator signal 136. Thus, the clock generator 104 may selectively sample the input clock signal 130 to generate the first local oscillator signal 136 having a phase that matches the phase of the load modulated signal 134. As explained above, the phase selector 106 may scan through multiple programmable delay parameters that each correspond to a different phase delay of the first local oscillator signal 136.

As illustrated by the fifth trace, the clock generator 104 may selectively sample clock edges of the input clock signal 130 to generate the second local oscillator signal 138. For example, based on a particular programmable delay parameter ($D_n$), the clock generator 104 may sample the input clock signal 130 at the rising edge 202 of the first clock pulse (i.e., clock pulse "0") to generate a falling edge of the second local oscillator signal 138. In addition, the clock generator 104 may sample the input clock signal 130 at the rising edge 206 of the $17^{th}$ clock pulse (i.e., clock pulse "16") to generate a rising edge of the second local oscillator signal 138.

It will be appreciated that selectively sampling the input clock signal 130 at different clock edges to generate local oscillator signals 136, 138 with different phases may generate baseband signals with different signal strengths when the local oscillator signals 136, 138 are mixed with the load modulated signal 134. For example, as described in further detail with respect to FIG. 3, a particular delay parameter ($D_n$) may be selected that corresponds to the highest determined signal strength or the lowest determined signal strength of the resulting baseband signals.

Figure 3:
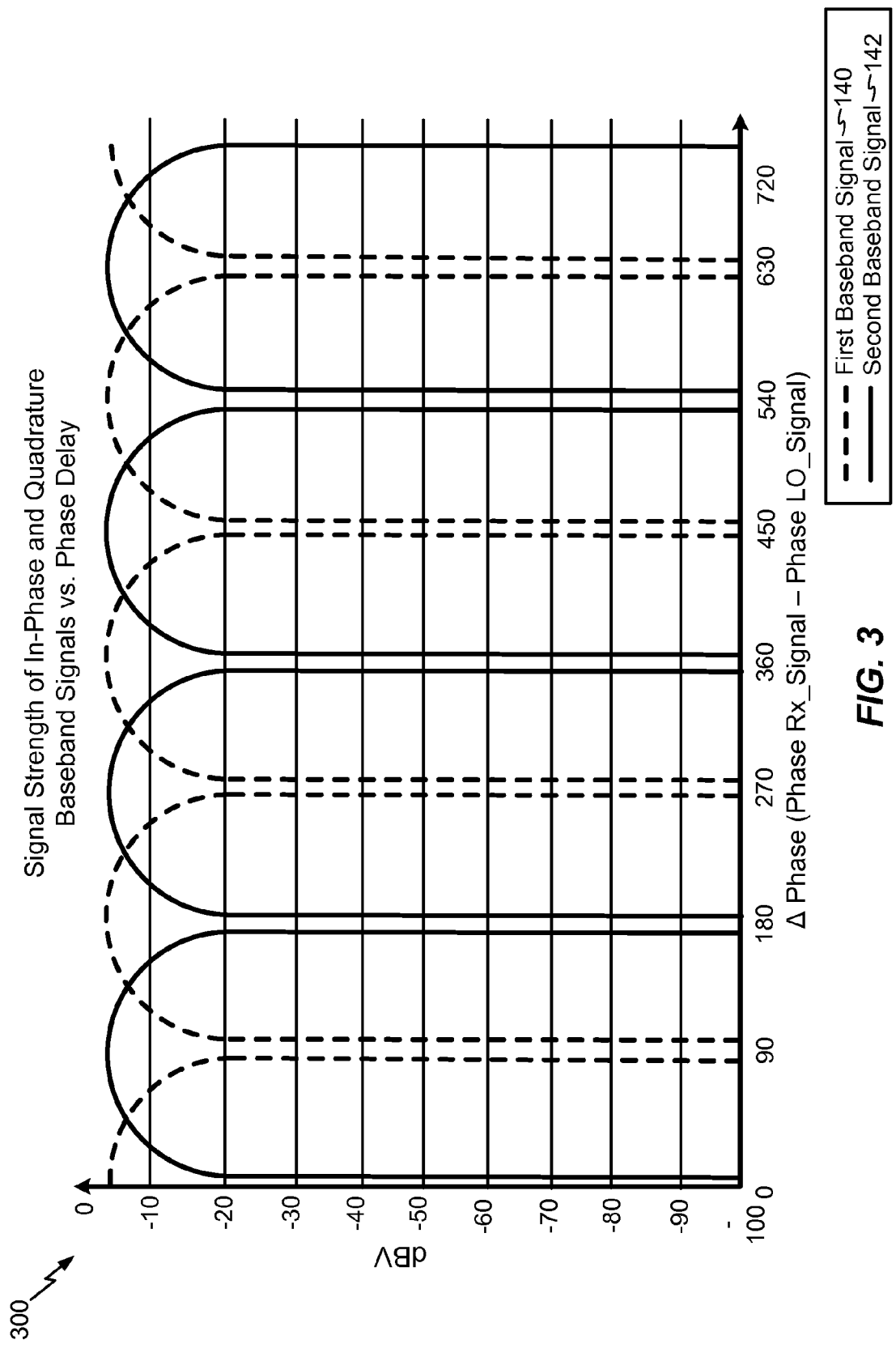
FIG. 3 is a graph that illustrates examples of signal strengths of in-phase and quadrature baseband signals in relation to a phase difference between a load modulated signal and a local oscillator signal.

Referring to FIG. 3, a graph 300 that illustrates examples of signal strengths of in-phase and quadrature baseband signals in relation to a phase difference between a load modulated signal and a local oscillator signal is shown. The horizontal axis of the graph 300 may correspond to a difference in phase between a load modulated signal and a local oscillator signal. The vertical axis of the graph 300 may correspond to a measured signal strength value in decibel-volts (dBV). The dotted line may correspond to the first baseband signal 140 (i.e., the in-phase baseband signal) of FIG. 1, and the solid line may correspond to the second baseband signal 142 (i.e., the quadrature baseband signal) of FIG. 1.

As illustrated in the graph 300, the first signal strength 152 of the first baseband signal 140 and the second signal strength 154 of the second baseband signal 142 may vary based on the difference in phase between the load modulated signal 134 and the local oscillator signal. For example, when the difference in phase between the load modulated signal and the local oscillator signal is approximately equal to zero degrees, the first signal strength 152 of the first baseband signal 140 may reach a maximum value and the second signal strength 154 of the second baseband signal 142 may reach a minimum value. As illustrated, the first signal strength of the first baseband signal 140 may reach approximately −3 dBV and the second signal strength of the second baseband signal 142 may fall below −100 dBV. The phase selector 106 of FIG. 1 may select a programmable delay parameter that corresponds to this particular scenario based on the strength indicator signal 144. In this particular scenario, the NFC initiator system 100 may tune to an in-phase path to improve the SNR when communicating to an NFC target device over the oscillating electromagnetic field 160. As shown by the graph 300, similar scenarios occur when the phase difference between the load modulated signal and the local oscillator signal is approximately 180°, 360°, 540°, 720°, etc.

When the difference in phase between the load modulated signal and the local oscillator signal is approximately equal to ninety degrees, the first signal strength 152 of the first baseband signal 140 may reach a minimum value and the second signal strength 154 of the second baseband signal 142 may reach a maximum value. For example, in the particular illustrated embodiment, the first signal strength of the first baseband signal 140 may fall below −100 dBV and the second signal strength of the second baseband signal may reach approximately −3 dBV. The phase selector 106 may select a programmable delay parameter that corresponds to this particular scenario based on the strength indicator signal 144. In this particular scenario, the NFC initiator system 100 may tune to a quadrature path to improve the SNR when communicating to the NFC target device over the oscillating electromagnetic field 160. As shown by the graph 300, similar scenarios occur when the phase difference between the load modulated signal and the local oscillator signal is approximately 270°, 450°, 630°, etc.

It will be appreciated that the phase selector 106 may select a programmable delay parameter that corresponds to when the signal strengths 152, 154 of a baseband signals 140, 142 reach a minimum value rather than a maximum value to reduce errors caused by spikes that generate high DC voltage levels of the baseband signals 140, 142. It will also be appreciated that the phase difference between the received signal and the local oscillator signal may be adjusted by the clock generator 104, as described with respect to FIG. 2, to obtain a desired phase noise for at least one of the baseband signals 140, 142. Upon obtaining a reduced phase noise (or signal strength 152, 154) for a particular baseband signal 140, 142, the NFC initiator system 100 may tune to a path associated with the particular baseband signal 140, 142. For example, upon obtaining the desired first signal strength 152 for the first baseband signal 140 (i.e., the in-phase baseband signal), the NFC initiator system 100 may tune to an in-phase path to reduce phase noise that may result from communicating with the NFC target device.

Figure 4:
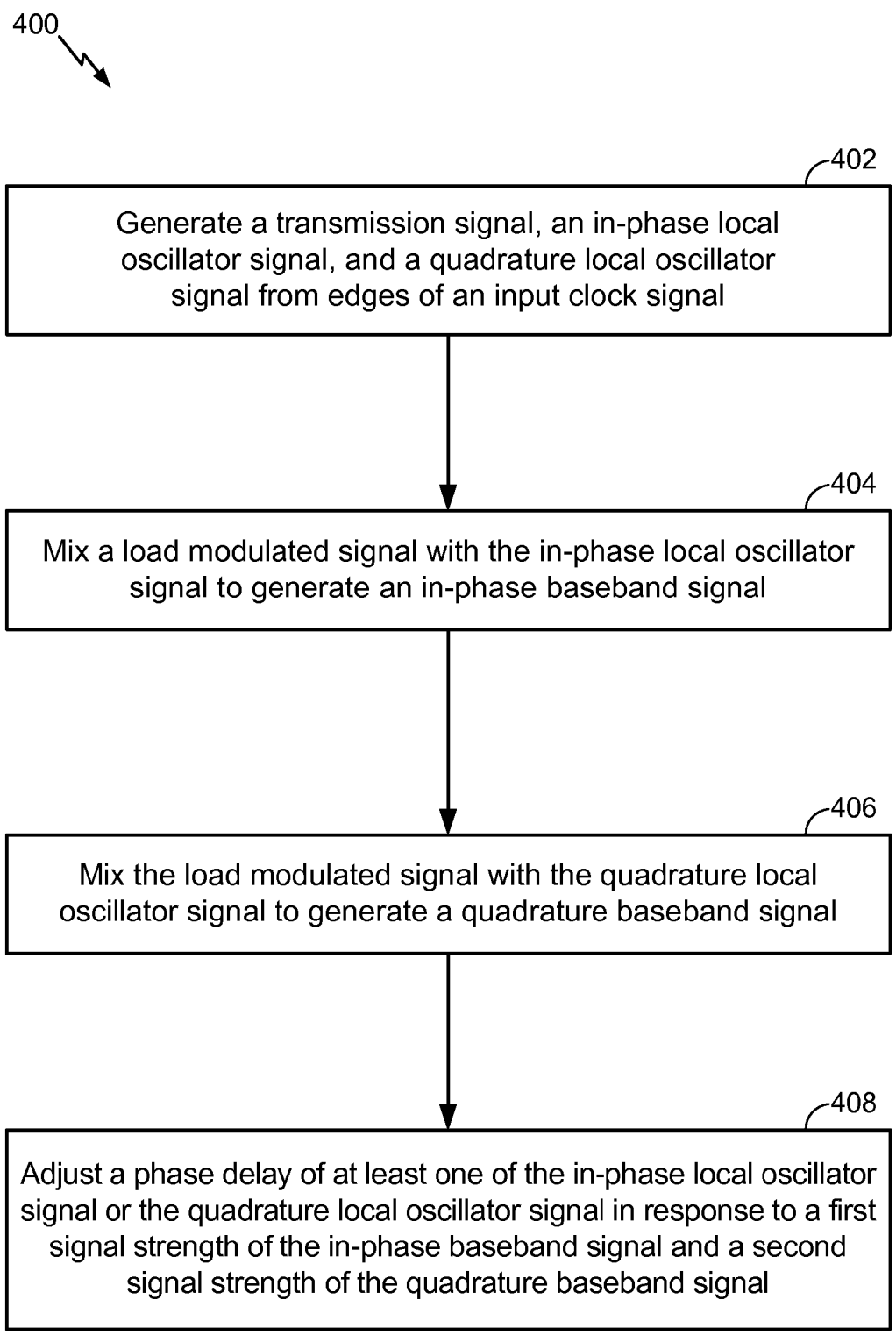
FIG. 4 is a flowchart to illustrate a particular embodiment of a method of reducing phase noise during NFC device signaling.

Referring to FIG. 4, a flowchart of a particular embodiment of a method 400 for reducing phase noise during Near Field Communication (NFC) device signaling is shown. In an illustrative embodiment, the method 400 may be performed using the NFC initiator system 100 of FIG. 1.

The method 400 may include generating a transmission signal, an in-phase local oscillator signal, and a quadrature local oscillator signal from edges of an input clock signal, at 402. For example, in FIG. 1, the clock generator 104 may receive the input clock signal 130 from the ring oscillator 103. In response to receiving the input clock signal 130, the clock generator 104 may sample the input clock signal 130 at the carrier frequency ($f_C$) to generate the transmission signal 132, the first local oscillator signal 136 (i.e., the in-phase local oscillator signal), and the second local oscillator signal 138 (i.e., the quadrature local oscillator signal). In a particular embodiment, the transmission signal 132 may be generated using a ring oscillator at an NFC initiator device.

A load modulated signal may be mixed with the in-phase local oscillator signal to generate an in-phase baseband signal, at 404. For example, in FIG. 1, the first mixer 110 may mix the load modulated signal 134 with the first local oscillator signal 136 (i.e., the in-phase local oscillator signal). The load modulated signal 134 may be generated at the matching network 108 from changes in the oscillating electromagnetic field 160 that are caused by an NFC target device selectively activating a load. The first mixer 110 may perform signal down-conversion by mixing the load modulated signal 134 with the first local oscillator signal 136 to generate the first baseband signal 140 (i.e., the in-phase baseband signal). In a particular embodiment, the load modulated signal 134 corresponds to a delayed version of the transmission signal 132.

The load modulated signal may be mixed with the quadrature local oscillator signal to generate a quadrature baseband signal, at 406. For example, in FIG. 1, the second mixer 112 may mix the load modulated signal 134 with the second local oscillator signal 138 (i.e., the quadrature local oscillator signal). The second mixer 112 may perform signal down-conversion by mixing the load modulated signal 134 with the second local oscillator signal 138 to generate the second baseband signal 142 (i.e., the quadrature baseband signal).

A phase delay of the in-phase local oscillator signal or the quadrature local oscillator signal may be adjusted in response to a measured first signal strength of the in-phase baseband signal and a measured second signal strength of the quadrature baseband signal, at 408. For example, in FIG. 1, the phase selector 106 may generate one or more control signals 146 indicating different programmable delay parameters. Each programmable delay parameter may correspond to different phases (i.e., different phase delays or phase shifts) of the first and second local oscillator signals 136, 138. The phase selector 106 may send one or more control signals 146 to the clock generator 104 to adjust a phase delay of at least one of the first local oscillator signal 136 (i.e., the in-phase local oscillator signal) or the second local oscillator signal 138 (i.e., the quadrature local oscillator signal) in response to the first signal strength 152 of the first baseband signal 140 and the second signal strength 154 of the second baseband signal 142. As described with respect to FIGS. 1-2, the clock generator 104 may adjust the phase delay of the local oscillator signals 136, 138 by selectively sampling the input clock signal 130 at different clock edges in accordance with the carrier frequency ($f_C$). In a particular embodiment, the phase delay may be adjusted to select a phase delay resulting in a reduced phase noise after mixing to increase an effective range of communication via the transmission signal 132 and the load modulated signal 134.

It will be appreciated that the method 400 of FIG. 4 may selectively reduce phase noise that may result from communicating with an NFC target device. For example, the method 400 may adjust a phase delay (i.e., a delay parameter) to generate a high DC voltage level for the first baseband signal 140 or to generate a high DC voltage level for the second baseband signal 142. As a result, an NFC initiator device, such as the NFC initiator system 100 of FIG. 1, may selectively tune to a path (i.e., an in-phase or quadrature path) that corresponds to the baseband signal 140, 142 having the high DC voltage level. When the first baseband signal 140 (i.e., the in-phase baseband signal) has a high DC voltage level, the phase noise associated with the in-phase path may be reduced, resulting in improved signal quality (i.e., an improved signal-to-noise ratio (SNR)) when the NFC initiator system 100 tunes to the in-phase path. When the second baseband signal 142 (i.e., the quadrature baseband signal) has a high DC voltage level, the phase noise associated with the quadrature path may be reduced, resulting in improved signal quality when the NFC initiator system 100 tunes to the quadrature path.

In a particular embodiment, the method 400 may include scanning multiple programmable delay parameters. For example, in FIG. 1, the phase selector 106 may scan through different values of programmable delay parameters and receive feedback (e.g. DC voltage level measurements for each baseband signal 140, 142) corresponding to each programmable delay parameter via the strength indicator signal 144. For example, the phase selector 106 may scan through multiple programmable delay parameters that each correspond to a different phase delay of the in-phase local oscillator signal (i.e., the first local oscillator signal 136) or the quadrature local oscillator signal (i.e., the second local oscillator signal 138).

In a particular embodiment, the method 400 may include determining the signal strength of the in-phase baseband signal for each programmable delay parameter and determining the signal strength of the quadrature baseband signal for each programmable delay parameter. For example, in FIG. 1, the phase selector 106 may select a first programmable delay parameter corresponding to a first phase delay of the local oscillator signals 136, 138. The signal analyzer 114 may determine (i.e., measure) the first signal strength 152 of the first baseband signal 140 for the first programmable delay parameter and determine (i.e., measure) the second signal strength 154 of the second baseband signal 142 for the first programmable delay parameter. The first signal strength 152 and the second signal strength 154 may be sent to the phase selector 106 via the strength indicator signal 144. The phase selector 106 may store the information and repeat the process for other programmable delay parameters corresponding to different phase delays of the local oscillator signals 136, 138 until the scan is completed.

In a particular embodiment, the method 400 may include selecting a programmable delay parameter from the multiple programmable delay parameters that corresponds to a highest determined signal strength or a lowest determined signal strength of the in-phase baseband signal. For example, in FIG. 1, the phase selector 106 may select a programmable delay parameter that corresponds to a high DC voltage level of the first baseband signal 140 (i.e., the in-phase baseband signal) or a low DC voltage level of the first baseband signal 140. The high DC voltage level for the first baseband signal 140 may correspond to the in-phase path having low phase noise and the low DC voltage level for the first baseband signal 140 may correspond to the quadrature path having low phase noise.

In a particular embodiment, the method 400 may include selecting a programmable delay parameter from the multiple programmable delay parameters that corresponds to a highest determined signal strength or a lowest determined signal strength of the quadrature baseband signal. For example, in FIG. 1, the phase selector 106 may select a programmable delay parameter that corresponds to a high DC voltage level of the second baseband signal 142 (i.e., the quadrature baseband signal) or a low DC voltage level of the second baseband signal 142. The high DC voltage level for the second baseband signal 142 may correspond to the quadrature path having low phase noise and the low DC voltage level for the second baseband signal 142 may correspond to the in-phase path having low phase noise.

In a particular embodiment, the method 400 may include determining delay parameters that correspond to a lowest detected value of the first signal strength or the second signal strength. For example, in FIG. 1, the phase selector 106 may receive DC measurements (i.e., first signal strength values) of the first baseband signal 140 for each programmable delay parameter and receive DC measurements (i.e., second signal strength values) of the second baseband signal 142 for each programmable delay parameter via the strength indicator signal 144. The phase selector 106 may determine which delay parameter corresponds to a lowest detected value (i.e., DC measurement) for the first baseband signal 140 and for the second baseband signal 142. The method 400 may also include adjusting the phase delay based on the delay parameters. For example, in FIG. 1, the clock generator 104 may adjust the phase delay of the local oscillator signals 136, 138 by selectively sampling the input clock signal 130 at different clock edges in accordance with the carrier frequency ($f_C$). To illustrate, the clock generator 104 may receive the input clock signal 130 from the ring oscillator as a high-speed input clock signal (e.g., a frequency of the input clock signal 130 may be approximately 433.92 MHz (e.g., substantially 32 times the carrier frequency ($f_C$))). The control signal 146 may correspond to a delay parameter selected by the phase selector 106 and may trigger the clock generator 104 to select a particular clock edge, where each clock edge corresponds to a different phase delay. The transmission signal 132, the first local oscillator signal 136 (i.e., the in-phase local oscillator signal), and the second local oscillator signal 138 (i.e., the quadrature local oscillator signal) may be generated via the clock generator 106 selectively sampling clock edges of the input clock signal 130.

It will be appreciated that the method 400 of FIG. 4 may selectively reduce phase noise that may result from communicating with an NFC target device. For example, the method 400 may adjust a phase delay (i.e., a delay parameter) to generate a high DC voltage level for the first baseband signal 140 or to generate a high DC voltage level for the second baseband signal 142. As a result, an NFC initiator device, such as the NFC initiator system 100 of FIG. 1, may selectively tune to a path (i.e., an in-phase or quadrature path) that corresponds to the baseband signal 140, 142 having the high DC voltage level.

Figure 5:
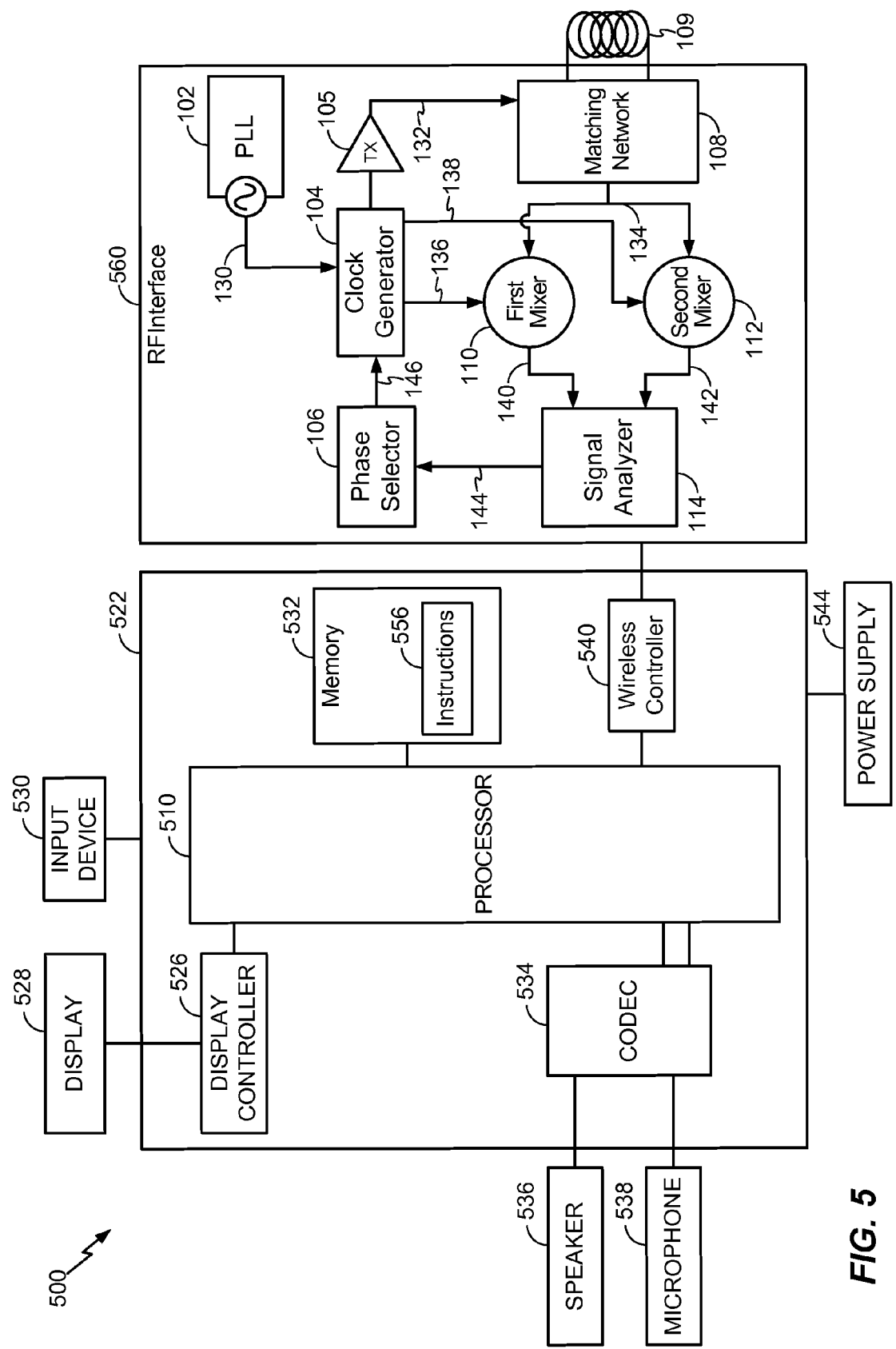
FIG. 5 is a block diagram of a wireless device including an NFC initiator system that is operable to reduce phase noise during NFC device signaling.

Referring to FIG. 5, a block diagram of a particular illustrative embodiment of a wireless communication device is depicted and generally designated 500. The device 500 includes a processor 510, such as a digital signal processor, coupled to a memory 532.

FIG. 5 also shows a radio frequency (RF) interface 560 disposed between a wireless controller 540 and an inductive coil 109, where the RF interface 560 includes the NFC initiator system 100 of FIG. 1. For example, the RF interface 560 includes the PLL 102, the ring oscillator 103, the clock generator 104, the transmission amplifier 105, the phase selector 106, the first and second mixers 110, 112, the signal analyzer 114, and the matching network 108.

The clock generator 104 may be coupled to the ring oscillator 103. Upon receiving a clock signal from the clock generator 104, the transmission amplifier 105 may generate the transmission signal 132. The first mixer 110 is responsive to an in-phase local oscillator signal (i.e., the first local oscillator signal 136) and to the load modulated signal 134 from an NFC target device located at least four centimeters from an NFC initiator device, such as the wireless communication device 500. The second mixer 112 is responsive to a quadrature local oscillator signal (i.e., the second local oscillator signal 138) and to the load modulated signal. The in-phase baseband signal (i.e., the first baseband signal 140) may be generated at the first mixer 110 based on the in-phase local oscillator signal and the load modulated signal. The quadrature baseband signal (i.e., the second baseband signal 142) may be generated at the second mixer 112 based on the quadrature local oscillator signal and the load modulated signal.

The phase selector 106 may be responsive to the first signal strength 152 of the in-phase baseband signal (i.e., the first baseband signal 140) and to the second signal strength 154 of the quadrature baseband signal (i.e., the second baseband signal 142). A phase of the in-phase local oscillator signal (i.e., the first local oscillator signal 136) or the quadrature local oscillator signal (i.e., the second local oscillator signal 138) is adjustable via the phase selector 106. The phase may be adjustable to reduce or substantially minimize a phase noise generated from mixing the load modulated signal 134 with the in-phase local oscillator signal or the quadrature local oscillator signal. The signal analyzer 114 may determine the first signal strength 152 and the second signal strength 154.

The memory 532 may be a tangible non-transitory processor-readable storage medium that includes executable instructions 556 for reducing phase in NFC device signaling. The instructions 556 may be executed by a processor, such as the processor 510 or a processor within the signal analyzer 114, to determine a first signal strength 152 of an in-phase baseband signal generated an NFC initiator device. For example, the instructions 556 may cause the processor to determine a first signal strength 152 of the first baseband signal 140. The in-phase baseband signal may be generated by mixing a load modulated signal with an in-phase local oscillator signal. The instructions 556 may also be executable to determine a second signal strength 154 of a quadrature baseband signal generated at the NFC initiator device. For example, the instructions 556 may cause the processor to determine a second signal strength 154 of the second baseband signal 142. The quadrature baseband signal may be generated by mixing the load modulated signal with a quadrature local oscillator signal. The instructions 556 may also be executable to adjust a phase delay of at least one of the in-phase local oscillator signal or the quadrature local oscillator signal in response to the first signal strength 152 and the second signal strength 154. For example, the instructions 556 may cause a processor, such as the processor 510 or a processor within the phase selector 106, to generate one or more control signals 146 indicating different programmable delay parameters. The clock generator 104 may receive the control signals 146 and adjust a phase of at least one of the first local oscillator signal 136 or the second local oscillator signal 138 in response to the first signal strength 152 of the first baseband signal 140 and the second signal strength 154 of the second baseband signal 142. The clock generator 104 may adjust the phase delay of the local oscillator signals 136, 138 by selectively sampling the input clock signal 130 at different clock edges.

FIG. 5 also shows a display controller 526 that is coupled to the processor 510 and to a display 528. A coder/decoder (CODEC) 534 can also be coupled to the processor 510. A speaker 536 and a microphone 538 can be coupled to the CODEC 534. FIG. 5 also indicates that the wireless controller 540 can be coupled to the digital signal processor 510.

In a particular embodiment, the processor 510, the display controller 526, the memory 532, the CODEC 534, and the wireless controller 540 are included in a system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the inductive coil 109, the power supply 544, and the RF interface 560 are external to the system-on-chip device 522. However, each of the display 528, the input device 530, the speaker 536, the microphone 538, the inductive coil 109, the power supply 544, and the RF interface 560 can be coupled to a component of the system-on-chip device 522, such as an interface or a controller.

In conjunction with the described embodiments, an apparatus for reducing phase noise in NFC device signaling is disclosed that includes means for generating a transmission signal, an in-phase local oscillator signal, and a quadrature local oscillator signal from edges of an input clock signal. For example, the means for generating the transmission signal, the in-phase local oscillator signal, and the quadrature local oscillator signal may include the PLL 102 of FIGS. 1 and 5, the ring oscillator 103 of FIGS. 1 and 5, the clock generator 104 of FIGS. 1 and 5, the processor 510 of FIG. 5 configured to execute the instructions 556 of FIG. 5, one or more other devices, circuits, modules, or processing devices to generate the transmission signal, the in-phase local oscillator signal, and the quadrature local oscillator signal, or any combination thereof.

The apparatus may also include means for mixing a load modulated signal with the in-phase local oscillator signal to generate an in-phase baseband signal. For example, the means for mixing the load modulated signal with the in-phase local oscillator signal may include the first mixer 110 of FIGS. 1 and 5, the processor 510 of FIG. 5 configured to execute the instructions 556 of FIG. 5, one or more other devices, circuits, modules, or processing devices to mixing the load modulated signal with the in-phase local oscillator signal, or any combination thereof.

The apparatus may also include means for mixing the load modulated signal with the quadrature local oscillator signal to generate quadrature baseband signal. For example, the means for mixing the load modulated signal with the quadrature local oscillator signal may include the second mixer 112 of FIGS. 1 and 5, the processor 510 of FIG. 5 configured to execute the instructions 556 of FIG. 5, one or more other devices, circuits, modules, or processing devices to mixing the load modulated signal with the quadrature local oscillator signal, or any combination thereof.

The apparatus may also include means for adjusting a phase delay of at least one of the in-phase local oscillator signal or the quadrature local oscillator signal in response to a first signal strength of the in-phase baseband signal and a second signal strength of the quadrature baseband signal. For example, the means for adjusting the phase delay may include the signal analyzer 114 of FIGS. 1 and 5, the phase selector 106 of FIGS. 1 and 5, the clock generator 104 of FIGS. 1 and 5, the processor 510 of FIG. 5 configured to execute the instructions 556 of FIG. 5, one or more other devices, circuits, modules, or processing devices to adjust the phase delay, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in the memory 532, such as random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method for reducing phase noise in near field communication (NFC) device signaling, the method comprising:
    generating a transmission signal, an in-phase local oscillator signal, and a quadrature local oscillator signal from edges of an input clock signal;
    mixing a load modulated signal with the in-phase local oscillator signal to generate an in-phase baseband signal;
    mixing the load modulated signal with the quadrature local oscillator signal to generate a quadrature baseband signal; and
    adjusting a phase delay of at least one of the in-phase local oscillator signal or the quadrature local oscillator signal in response to a first signal strength of the in-phase baseband signal and a second signal strength of the quadrature baseband signal.

2. The method of claim 1, further comprising scanning multiple programmable delay parameters, wherein each programmable delay parameter corresponds to a different phase delay of at least one of the in-phase local oscillator signal relative to the generated transmission signal or the quadrature local oscillator signal relative to the generated transmission signal.

3. The method of claim 2, further comprising:
    determining a signal strength of the in-phase baseband signal for each programmable delay parameter; and
    determining a signal strength of the quadrature baseband signal for each programmable delay parameter.

4. The method of claim 3, further comprising selecting a programmable delay parameter from the multiple programmable delay parameters, wherein the selected programmable delay parameter corresponds to a highest determined signal strength or a lowest determined signal strength of the in-phase baseband signal.

5. The method of claim 3, further comprising selecting a programmable delay parameter from the multiple programmable delay parameters, wherein the selected programmable delay parameter corresponds to a highest determined signal strength or a lowest determined signal strength of the quadrature baseband signal.

6. The method of claim 1, wherein the input clock signal is a high-resolution clock signal generated within an NFC initiator device.

7. The method of claim 1, further comprising determining delay parameters that correspond to a lowest detected value of one of the first signal strength or the second signal strength, wherein the delay parameters represent a first phase difference between the transmission signal and the in-phase local oscillator signal and a second phase difference between the transmission signal and the quadrature local oscillator signal.

8. The method of claim 7, further comprising adjusting the phase delay based on the delay parameters.

9. The method of claim 1, wherein adjusting the phase delay is performed by an NFC initiator device to reduce phase noise during data communication with a radio frequency identification (RFID) tag of an NFC target device.

10. The method of claim 1, wherein adjusting the phase delay is performed to reduce phase noise during data communication with a wireless system that uses electromagnetic fields to transfer data.

11. The method of claim 1, further comprising receiving a high-speed input clock signal.

12. The method of claim 11, wherein the transmission signal, the in-phase local oscillator signal, and the quadrature local oscillator signal are generated by selectively sampling clock edges of the high-speed input clock signal.

13. The method of claim 1, wherein the phase delay is adjusted to select a phase difference between the transmission signal and one of the local oscillator signals that results in a reduced phase noise after mixing to increase an effective range of communication via the transmission signal and the load modulated signal.

14. The method of claim 1, wherein the transmission signal is generated using a ring oscillator at an NFC initiator device.

15. The method of claim 1, wherein the load modulated signal is generated based on NFC signaling with an NFC target device.

16. An apparatus for reducing phase noise in near field communication (NFC) device signaling, the apparatus comprising:
    means for generating a transmission signal, an in-phase local oscillator signal, and a quadrature local oscillator signal from edges of an input clock signal;
    means for mixing a load modulated signal with the in-phase local oscillator signal to generate an in-phase baseband signal;
    means for mixing the load modulated signal with the quadrature local oscillator signal to generate a quadrature baseband signal; and
    means for adjusting a phase delay of at least one of the in-phase local oscillator signal or the quadrature local oscillator signal in response to a first signal strength of the in-phase baseband signal and a second signal strength of the quadrature baseband signal.

17. The apparatus of claim 16, further comprising means for scanning multiple programmable delay parameters, wherein each programmable delay parameter corresponds to a different phase delay of at least one of the in-phase local oscillator signal relative to the generated transmission signal or the quadrature local oscillator signal relative to the generated transmission signal.

18. The apparatus of claim 16, further comprising means for determining delay parameters that correspond to a lowest detected value of one of the first signal strength or the second signal strength.

19. The apparatus of claim 16, wherein the input clock signal is a high-resolution clock signal generated within an NFC initiator device.

20. The apparatus of claim 16, wherein the means for generating includes means for selectively sampling clock edges of the input clock signal.

21. The apparatus of claim 16, wherein the load modulated signal is generated based on NFC signaling with an NFC target device.

22. An apparatus for reducing phase noise in near field communication (NFC) device signaling, the apparatus comprising:
an NFC initiator device including:
a ring oscillator;
a clock generator coupled to the ring oscillator, wherein a transmission signal generated by the clock generator is based on a clock signal that is generated by the ring oscillator;
a first mixer responsive to an in-phase local oscillator signal and to a load modulated signal that is generated based on NFC signaling with an NFC target device;
a second mixer responsive to a quadrature local oscillator signal and to the load modulated signal, wherein an in-phase baseband signal is generated at the first mixer based on the in-phase local oscillator signal and the load modulated signal; and wherein a quadrature baseband signal is generated at the second mixer based on the quadrature local oscillator signal and the load modulated signal; and
a phase selector responsive to a first signal strength of the in-phase baseband signal and to a second signal strength of the quadrature baseband signal. wherein a phase of at least one of the in-phase local oscillator signal or the quadrature local oscillator signal is adjustable via the phase selector.

23. The apparatus of claim 22, wherein the NFC target device is located at least four centimeters from the NFC initiator device.

24. The apparatus of claim 22, wherein the NFC initiator device further includes a signal analyzer to determine the first signal strength of the in-phase baseband signal and the second signal strength of the quadrature baseband signal.

25. The apparatus of claim 22, wherein the phase is adjustable to reduce a phase noise generated from mixing the load modulated signal with the in-phase local oscillator signal or the quadrature local oscillator signal.

26. A non-transitory computer-readable storage medium, the non-transitory computer-readable storage device including instructions for reducing phase noise in near field communication (NFC) device signaling that, when executed by a processor, cause the processor to:
determine a first signal strength of an in-phase baseband signal generated at an NFC initiator device, wherein the in-phase baseband signal is generated by mixing a load modulated signal with an in-phase local oscillator signal;
determine a second signal strength of a quadrature baseband signal generated at the NFC initiator device, wherein the quadrature baseband signal is generated by mixing the load modulated signal with a quadrature local oscillator signal; and
adjust a phase delay of at least one of the in-phase local oscillator signal or the quadrature local oscillator signal in response to the first signal strength and the second signal strength.

27. The non-transitory computer-readable storage medium of claim 26, further comprising instructions that, when executed by the processor, cause the processor to scan multiple programmable delay parameters, wherein each programmable delay parameter corresponds to a different phase delay of at least one of the in-phase local oscillator signal or the quadrature local oscillator signal.

28. The non-transitory computer-readable storage medium of claim 27, further comprising instructions that, when executed by the processor, cause the processor to:
determine a signal strength of the in-phase baseband signal for each programmable delay parameter; and
determine a signal strength of the quadrature baseband signal for each programmable delay parameter.

29. The non-transitory computer-readable storage medium of claim 28, further comprising instructions that, when executed by the processor, cause the processor to select a programmable delay parameter from the multiple programmable delay parameters that corresponds to a highest determined signal strength or a lowest determined signal strength of the in-phase baseband signal.

30. The non-transitory computer-readable storage medium of claim 28, further comprising instructions that, when executed by the processor, cause the processor to select a programmable delay parameter from the multiple programmable delay parameters that corresponds to a highest determined signal strength or a lowest determined signal strength of the quadrature baseband signal.

\* \* \* \* \*